United States Patent [19]

Ito et al.

[11] Patent Number: 4,798,188

[45] Date of Patent: Jan. 17, 1989

[54] METHOD OF CONTROLLING INJECTOR

[75] Inventors: Shoji Ito; Mikio Minoura, both of Obu, Japan

[73] Assignee: Aisan Kogyo Kabushiki Kaisha, Obu, Japan

[21] Appl. No.: 126,638

[22] Filed: Nov. 30, 1987

[30] Foreign Application Priority Data

Dec. 4, 1986 [JP] Japan ................................ 61-289603

[51] Int. Cl.$^4$ ....................... F02M 51/08; H01L 41/08

[52] U.S. Cl. .................................... 123/478; 123/498; 239/585; 251/129.18

[58] Field of Search ............... 123/472, 478, 498, 490; 251/129.18; 239/585

[56] References Cited

U.S. PATENT DOCUMENTS

| | | | |
|---|---|---|---|
| 3,500,799 | 3/1970 | Benson | 123/478 |
| 3,830,204 | 8/1974 | McAlister | 123/473 X |
| 4,307,838 | 12/1981 | Martin . | |
| 4,499,878 | 2/1985 | Igashira et al. | 123/478 |
| 4,705,003 | 11/1987 | Sakakibara et al. | 123/490 X |
| 4,732,129 | 3/1988 | Takigawa et al. | 123/478 |

FOREIGN PATENT DOCUMENTS

| | | |
|---|---|---|
| 1576329 | 8/1971 | Fed. Rep. of Germany . |
| 2701447 | 7/1977 | Fed. Rep. of Germany . |
| 142845 | 6/1987 | Japan . |

*Primary Examiner*—Tony M. Argenbright
*Attorney, Agent, or Firm*—Dennison, Meserole, Pollack & Scheiner

[57] ABSTRACT

In an injector for intermittently injecting liquid fuel by supplying a pulse signal to an actuator for reciprocating a valve body, a method of controlling the injector comprises the steps of changing the width of the pulse signal to thereby control an open time of the injector, and also changing a voltage of the pulse signal to thereby control a stroke of the valve body.

4 Claims, 9 Drawing Sheets

METHOD OF CONTROLLING INJECTOR

BACKGROUND OF THE INVENTION

The present invention relates to a method of controlling an injector for supplying fuel to an engine.

One example of the injector which is controllable by this invention is shown in FIG. 2. A valve body 30 is slidable in a valve housing 27, and the fuel is supplied through an injector hole 31 while the valve body 30 is moved rearwardly (right direction in FIG. 2).

In a conventional injector controlling method, the quantity of the fuel supplied from the injector during every reciprocating stroke of the valve body is controlled by a timing device. (The quantity of the fuel supplied per unit time is also varied by the frequency of the stroke.) In the following description, "fuel flow" means the quantity of fuel supplied with every valve body stroke.

When an engine is equipped with a supercharger turbine, the quantity of the fuel to be supplied with each suction stroke of the engine is increased during turbine operations. The injection valve open time cannot exceed the duration of suction stroke, therefore, the injector must be designed to be able to supply a large amount of fuel per unit time. Accordingly with such an injector, it may become very difficult to control the quantity of fuel flow with accuracy particularly in a relatively low fuel flow range, because of the difficulty of controlling the relatively short valve timing cycle with accuracy.

Therefore, it has been very difficult to adjust fuel flow with accuracy in a wide dynamic fuel flow range.

SUMMARY OF THE INVENTION

It is an object of the present invention to provide a method of controlling an injector which can control a fuel flow quantity with adequate accuracy over a wide dynamic range.

It is another object of the present invention to provide a method of controlling an injector which can control fuel flow quantity with a high accuracy both in a relatively low and high fuel flow range.

It is a further object of the present invention to provide a method of controlling an injector which is responsive to provide a good fuel flow control with the accuracy required for obtaining a desired engine operational characteristic under various engine operating conditions.

According to the present invention, there is provided in an injector for intermittently injecting liquid fuel by supplying a pulse signal to an actuator for reciprocating a valve body; a method of controlling the injector comprising the steps of varying the width of the pulse signal to thereby control open time of the injector, and also varying the voltage applied to the injector to control the stroke of the valve body.

The invention will be more fully understood from the following detailed description and appended claims when taken with the accompanying drawings.

DETAILED DESCRIPTION OF THE PREFERRED EMBODIMENTS

Figure 1:
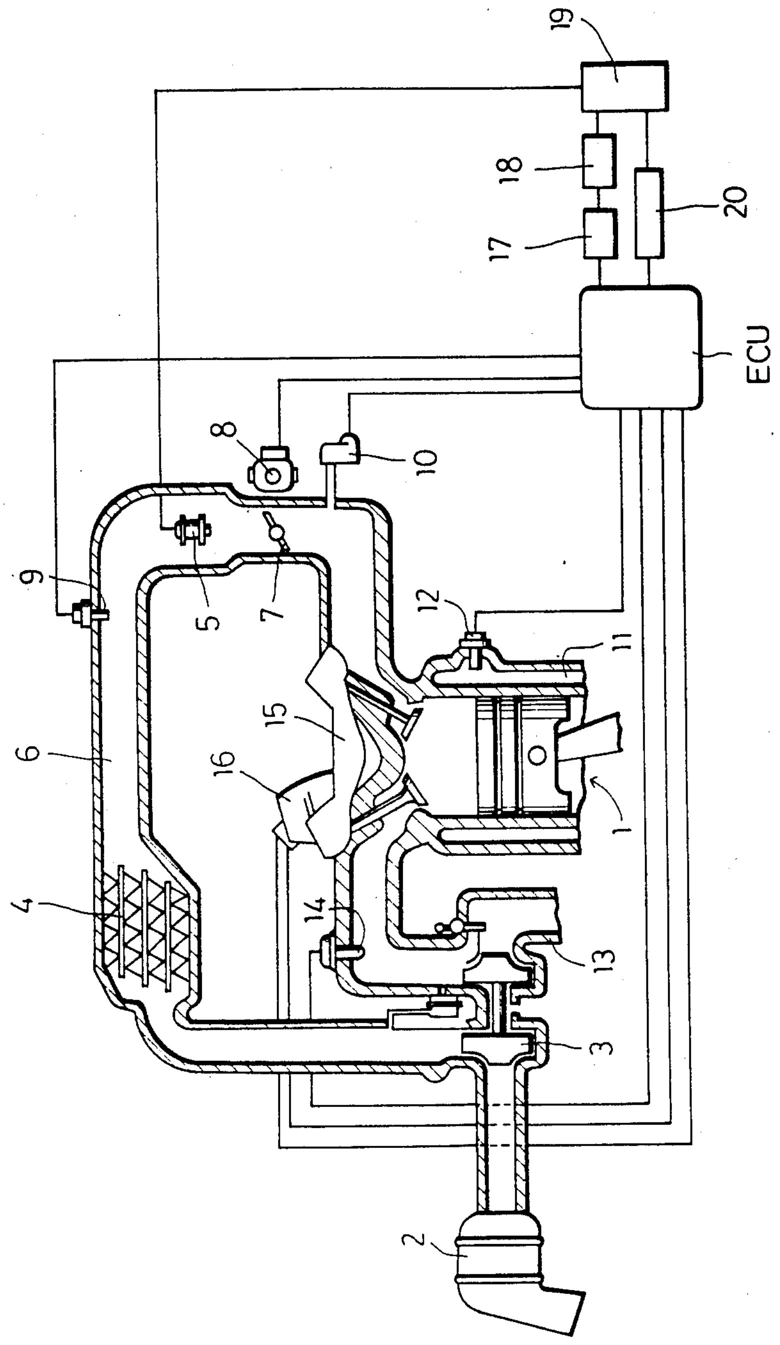
FIG. 1 is a schematic illustration of a first preferred embodiment according to the present invention.

Referring to FIG. 1, reference numeral 1 designates a supercharged engine adapted to be supplied with suction air through an air filter 2, a suction turbine 3 of a supercharger and an intercooler 4. Fuel is supplied from an injector 5 positioned in a suction pipe 6. A throttle valve 7 is mounted downstream of the injector 5 and is normally biased by a spring (not shown) in a valve closing direction. The throttle valve is opened in response to depression of an accelerator pedal (not shown). A throttle valve opening sensor 8 generates an output signal corresponding to an opening angle of the throttle valve 7. A suction air temperature sensor 9 in the suction pipe 6 generates an output signal corresponding to suction air temperature. An intake manifold pressure sensor 10 in the suction pipe 6 generates an output signal corresponding to intake manifold pressure. A cooling water temperature sensor 12 in the water jacket 11 generates an output signal corresponding to cooling water temperature. An exhaust gas sensor 14 in exhaust pipe 13 generates an output signal corresponding to exhaust gas. A crank angle sensor 16 in cylinder head 15 generates an output signal corresponding to the engine crank shaft angle.

Each of the above-mentioned sensors is operatively connected to an electronic control unit ECU having a microcomputer. The electronic control unit ECU calculates the required fuel flow quantity based on the signals derived from the sensors. Furthermore, the ECU generates a driving voltage signal for controlling the valve stroke in the injector 5. The signal is fed through a D/A converter 17 and an operational amplifier 18 to a driving circuit 19 for the injector 5. ECU also generates a pulse signal for controlling the valve open time of the injector 5, which signal is fed through a waveform shaper 20 to the driving circuit 19.

Figure 3:
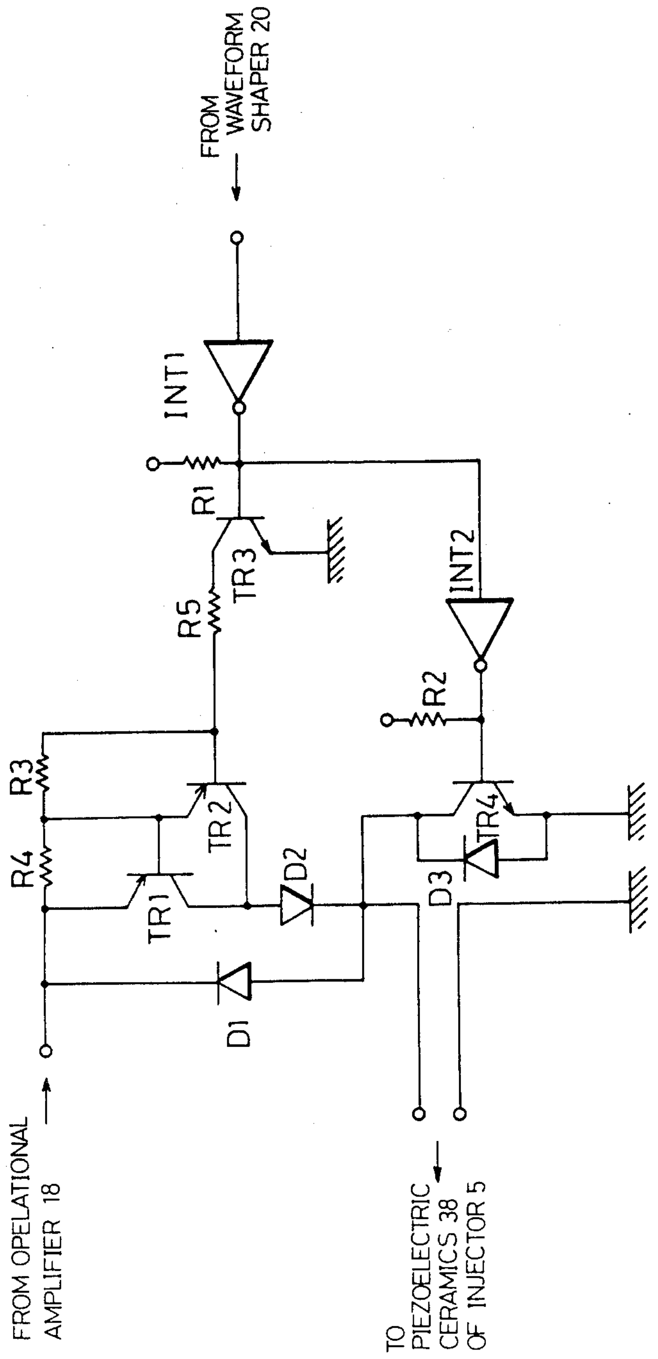
FIG. 3 is a circuit diagram of a driving circuit for the injector.

FIG. 3 illustrates the driving circuit 19 comprising inverters INT1 and INT2, transistors TR1–TR4 , diodes D1–D3 and resistors R1–R5. The injector 5 is actuated by a voltage signal outputted from the driving circuit 19

Figure 2:
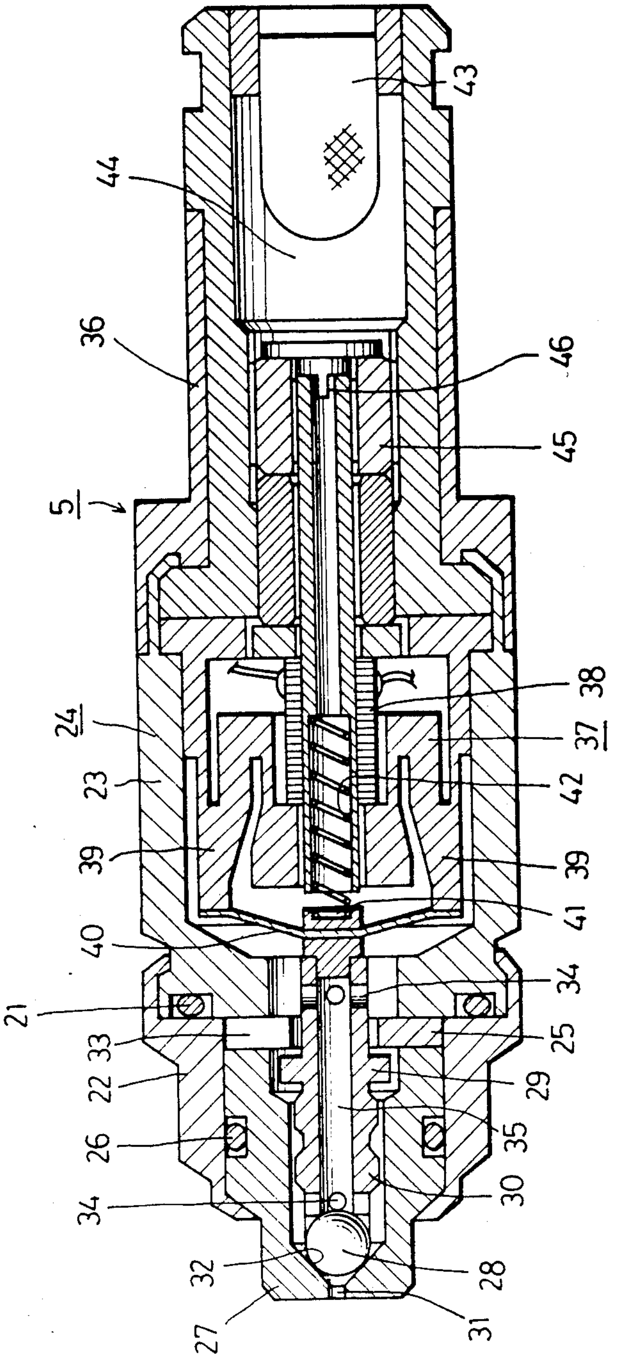
FIG. 2 is a vertical sectional view of the injector shown in FIG. 1.

Referring to FIG. 2 which shows the injector 5 in cross section. A front case 22 and a rear case 23 are assembled with each other to form an injector housing 24 with an O-ring seal 21 interposed therebetween. A valve housing 27 is housed in the front case 22 with an O-ring seal 26 interposed therebetween, and a stopper 25 is positioned between the valve housing 27 and the injector housing 24. A valve body 30 having a ball valve 28 and a sleeve plunger 29 is housed in the valve housing 27. The valve body 30 is axially movable within a limited distance between the front end surface of the stopper 25 and a valve seat 32 formed in the periphery of a fuel injection hole 31 at the front end of the valve housing 27. The fuel injection hole 31 is closed when the valve body 30 is moved toward the fuel injection hole 31 and the ball valve 28 abuts the valve seat 32. The fuel injection hole 31 is opened when the valve body 30 is moved toward the stopper 25, thereby allowing fuel to flow through a slit 33 in the stopper 25, communication holes 34 formed at both ends of the sleeve plunger 29 and a fuel passage 35 in the sleeve plunger 29 and injecting the fuel from the fuel injection hole 31.

A piping connector 36 is connected to the rear case 23 of the injector housing 24, and an actuator 37 for reciprocatively driving the valve body 30 is mounted in the rear case 23. The actuator 37 includes stacked piezoelectric ceramics 38 adapted to be expanded in the direction of stack by receiving a driving voltage signal, a lever 39 having a cross-sectional S-shaped configuration and adapted to be widened by the expansion of the stacked piezoelectric ceramics 38. A displacement magnifying strip 40 is deformed from its normal curved condition to a flat condition by the action of the lever 39, and a connecting member 41 interconnecting the actuator 37 with the valve body 30.

A fuel supply passage 44 is formed along the axis of the piping connector 36, and a fuel strainer 43 is mounted in the fuel supply passage 44. A large-diameter screw 45 is engaged in the fuel supply passage 44, and is adjusted to position the stacked piezoelectric ceramics 38. A small-diameter screw 46 is engaged with the large-diameter screw 45, and provides a biasing force against spring 42 for normally biasing the valve body 30 in a valve closing direction.

In the above-mentioned injector, when the driving voltage signal is applied to the stacked piezoelectric ceramics 38, the valve is opened, while when the driving voltage signal is not applied, the valve is closed by the spring 42. Further, the stroke of the valve body is adjustable by a value of the voltage of the driving voltage signal. However, when a voltage greater than a predetermined value is applied, the valve body 30 abuts against the stopper 25 to inhibit the rearward movement and maintain the valve body in the open condition.

Figure 4:
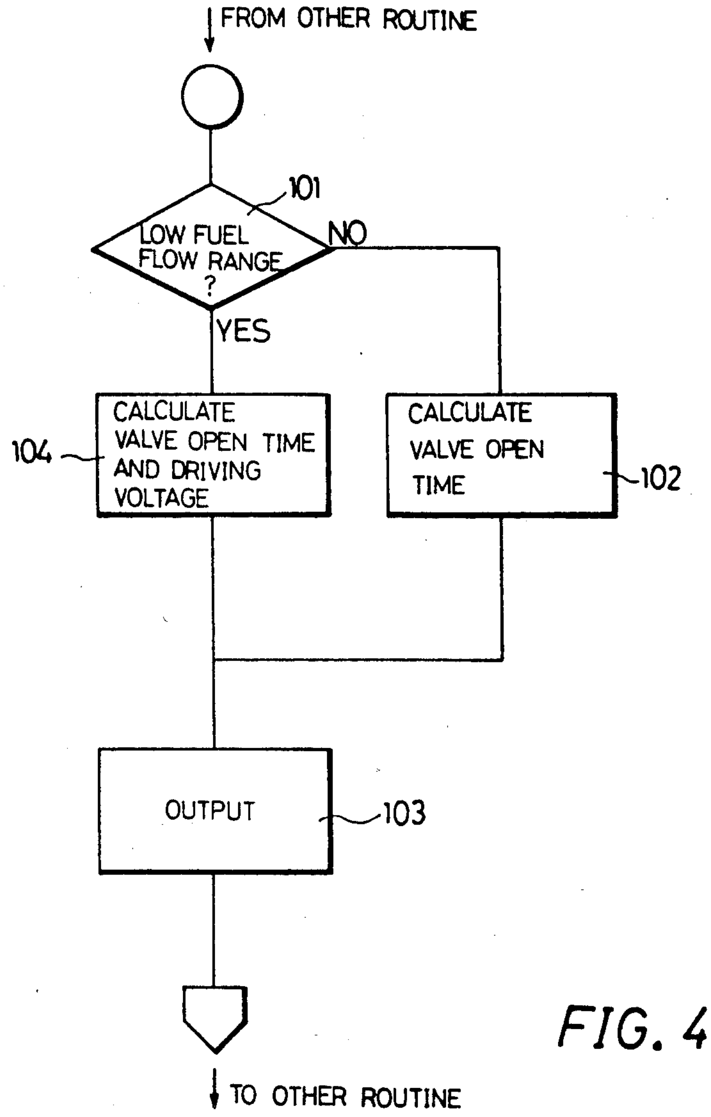
FIG. 4 is a flow chart for controlling the injector.

The flow chart for controlling the injector is shown in FIG. 4. In this embodiment, it is determined in step 101 whether or not the engine 1 is under low fuel flow range. If the answer in step 101 is no, that is, the engine 1 is under high fuel flow range, the program proceeds to step 102, where valve open time is calculated by the ECU and the driving voltage signal is set to a certain value that makes the valve body 30 abut against the stopper 25. This voltage is shown as V1 in FIG. 10(*a*), and the pulse signal to be applied to the injector is shown by a solid line in FIG. 5. In this control mode, the valve body displacement becomes full stroke operation and the relation between the fuel flow and pulse width is shown by a solid line in FIG. 6.

Figure 6:
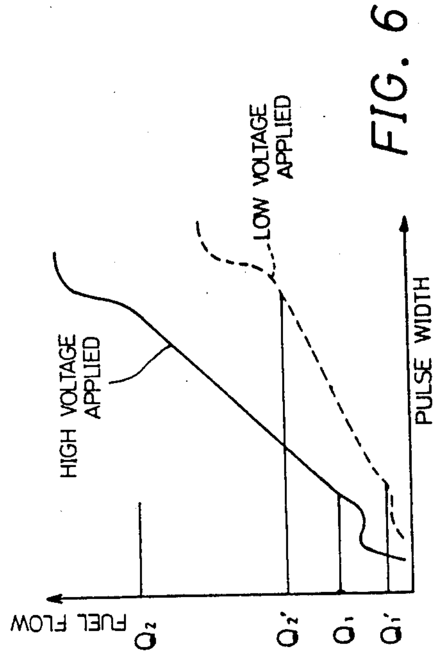
FIG. 6 is a graph showing an operational characteristic of the injector.

As shown in FIG. 6, the linear relation between the fuel flow and pulse width is obtained in the high fuel flow range, that is, the fuel flow is between Q2 and Q1. Therefore, accurate fuel flow control at high fuel flow range can be obtained.

However, at a low fuel flow range, that is, the fuel flow is less than Q1, the linear relation is broken due to the valve body bounding effects or inertia of the valve body, etc. Therefore, accurate fuel flow control cannot be obtained at low flow range.

According to the embodiment shown in FIG. 4, if it is determined that the engine 1 is under low fuel flow range in step 101 such as at idling or at low speed or low road running, the program proceeds to step 104, where both the valve open time and the driving voltage are calculated. In this embodiment, the driving voltage is set to a predetermined reduced voltage as shown as V2 in FIG. 10(*a*), and the pulse signal to be applied to the injector is shown by a dashed line in FIG. 5. Under this driving voltage, the valve body 30 moves not to abut against the stopper 25. In this control mode, the valve stroke becomes short and the relation between the fuel flow and pulse width is shown by a dashed line in FIG. 6.

As shown in FIG. 6, the linear relation is obtained at a range of fuel flow between Q1′ to Q2′. That means that the linear relation is obtained at a range where the fuel flow is smaller than Q1. Therefore, accurate fuel flow control can be achieved at low fuel flow range.

Figure 10:
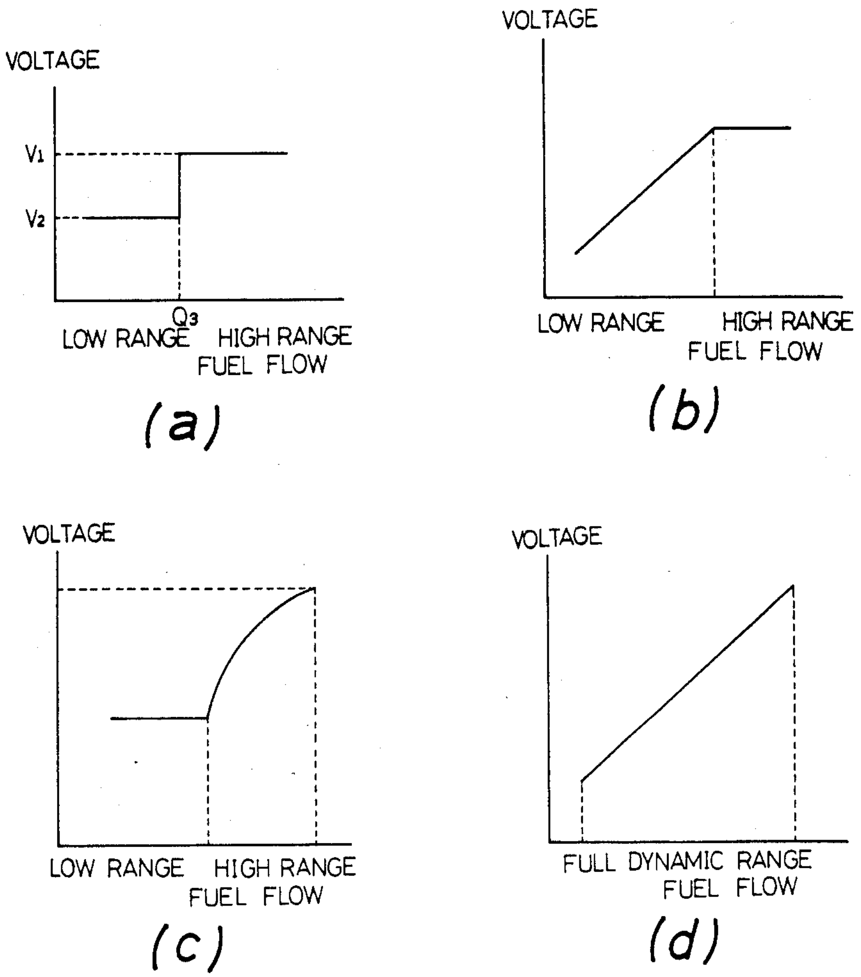
FIGS 10*a–d* show the relations between fuel flow and voltage to be applied to the injector.

As shown in FIG. 6, at the range of fuel flow between Q1 and Q2′, both the fuel stroke controlling mode and limited stroke controlling mode perform a linear relation. Therefore, at this range, both controlling modes can be adapted. Accordingly, the standard value to be judged in step 101 in FIG. 4 may be the value Q3 between Q1 and Q2′. The voltage to be applied to the injector is varied at Q3 as shown in FIG. 10(*a*). Additionally, in the case of such a short stroke, the valve body 30 is inhibited from abutting against the stopper 25, thereby greatly reducing noise from the injector 5.

Figure 5:
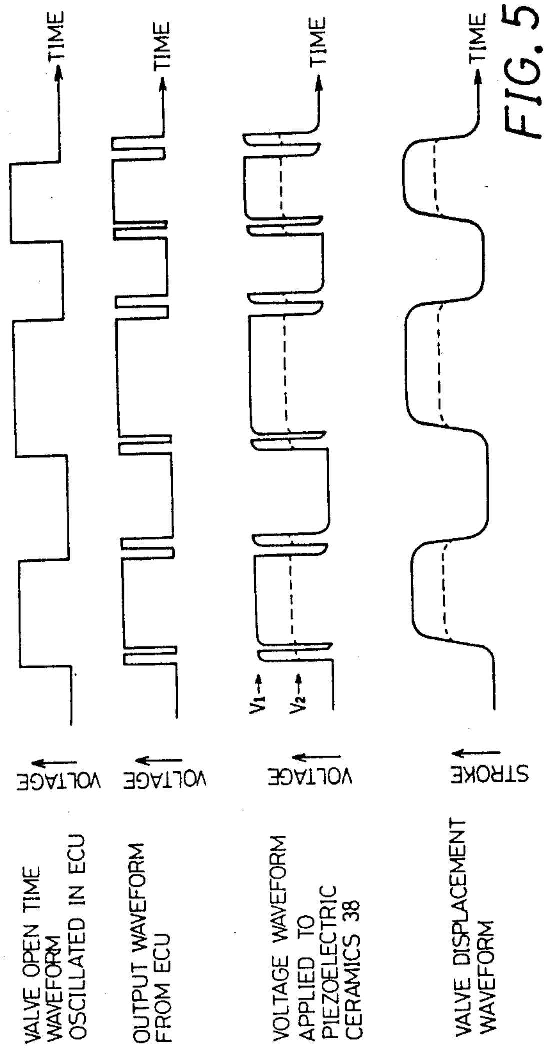
FIG. 5 is a waveform diagram of the driving circuit.

The pulse waveform control in correspondence with the valve opening and closing operation as shown in FIG. 5 is disclosed in Japanese Patent Laid-Open Publication No. 62-142845 published June 26, 1987 (corresponding to Japanese patent application No. 60-283679 filed Dec. 17, 1985) by the same applicant.

In another mode of the valve stroke control, when a supercharged pressure is not applied, the valve stroke is controlled to be short by a low voltage, and when the supercharged pressure is applied, the valve stroke is controlled to range from a short stroke to a long stroke according to the magnitude of the supercharged pressure. Since the intake manifold pressure is positive at the supercharged pressure, an increased dynamic range is required for the fuel supply control. The relation between voltage and fuel flow in this mode is schematically shown in FIG. 10(*c*).

In another mode of the valve stroke control, the voltage at low fuel range may be decreased to correspond to the fuel flow as schematically shown in FIG. 10(*b*). Furthermore, the driving voltage may be varied continuously to correspond to the fuel flow to be adjusted as schematically shown in FIG. 10(*d*). By doing so, the range of the valve to be controlled is reduced and wide dynamic range open time of fuel flow is achieved.

Figure 7:
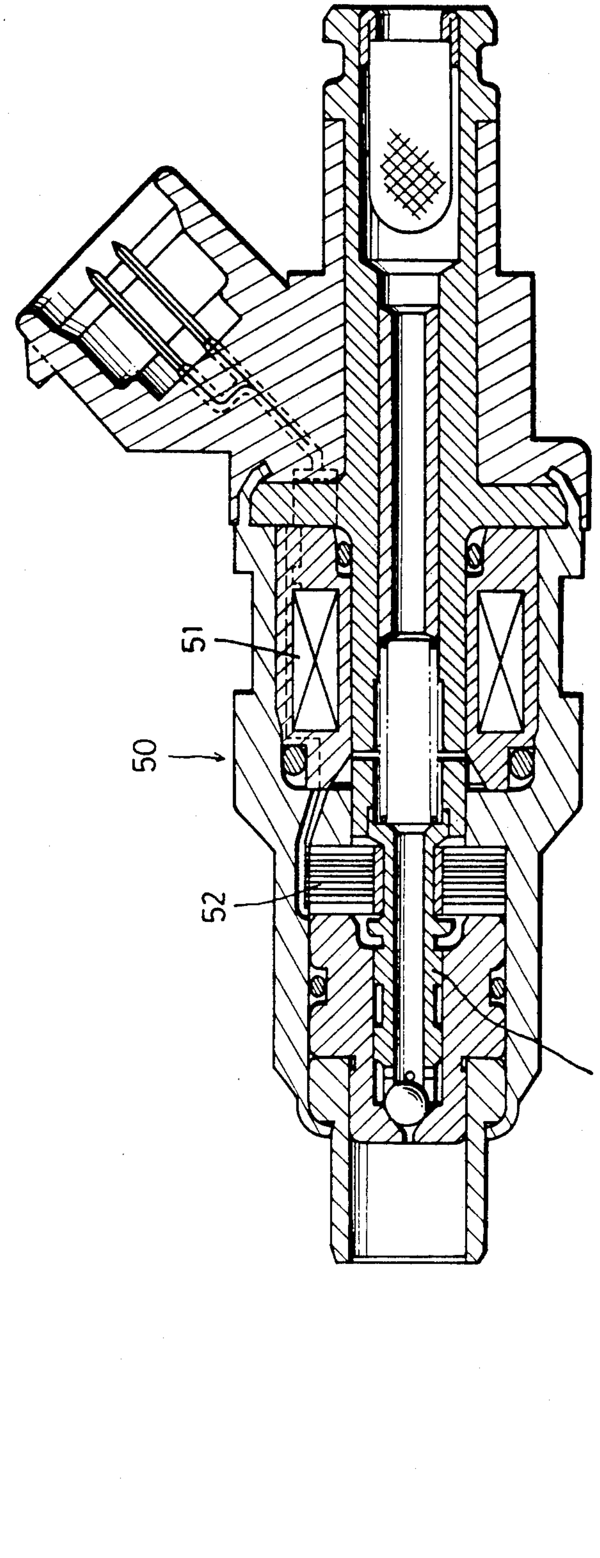
FIG. 7 is a vertical sectional view of the injector of a second preferred embodiment.
Figure 8:
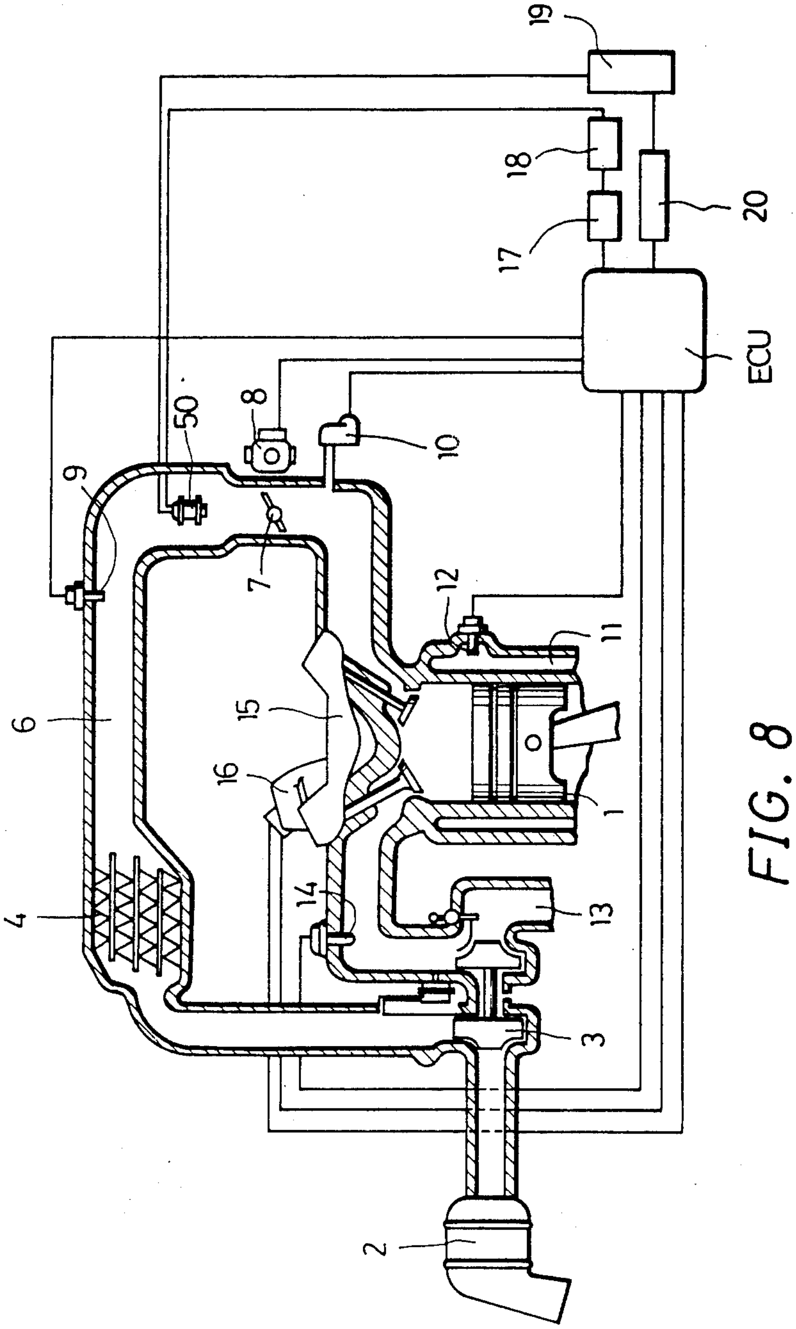
FIG. 8 is a schematic illustration of the second preferred embodiment, similar to FIG. 1.
Figure 9:
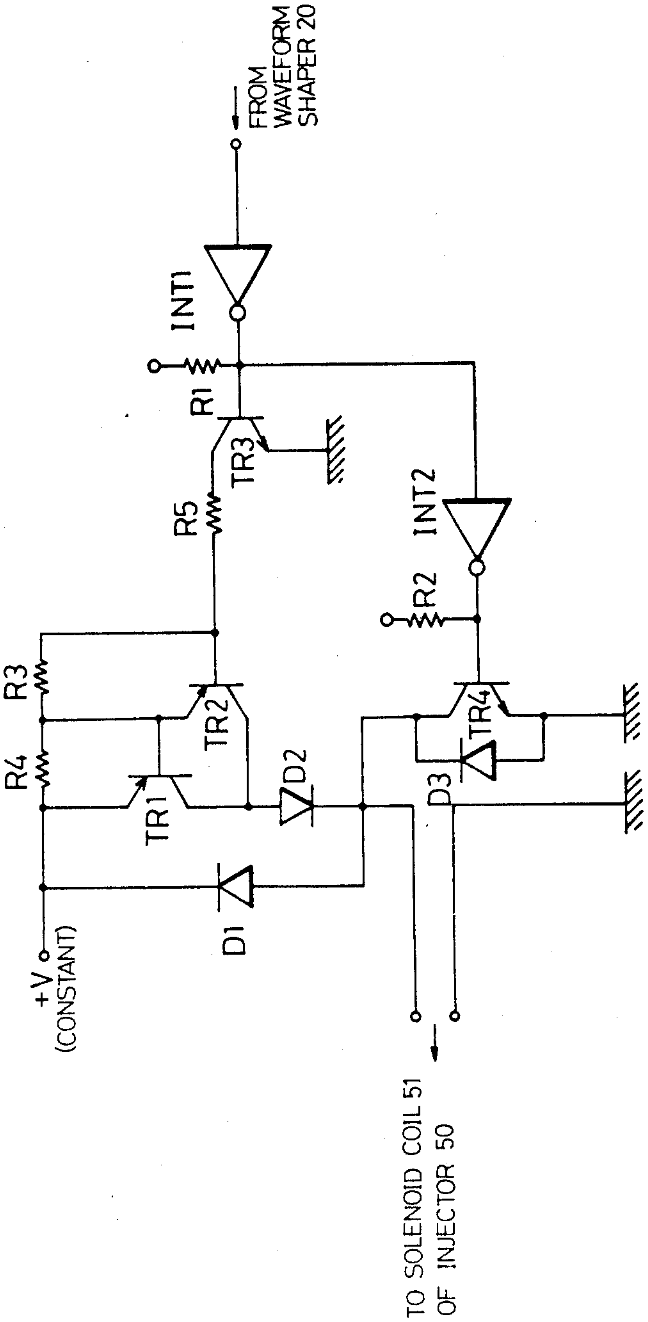
FIG. 9 is a circuit diagram of a driving circuit shown in FIG. 8.

Referring next to FIGS. 7 to 9 which show another preferred embodiment of the present invention, a solenoid coil 51 is substituted for the stacked piezoelectric ceramics 38 in the previous embodiment. A stacked piezoelectric ceramics 52 is substituted for the stopper 25 in the previous embodiment. The stacked piezoelectric ceramics 52 operates to vary the valve body stop position and valve body stroke by varying a voltage to be applied thereto. When the engine 1 requires low fuel flow, the voltage is applied to the stacked piezoelectric ceramic 52 to increase its thickness and reduce the valve stroke. Therefore, accurate flow control at the low flow range can be obtained. On the contrary, when the engine 1 requires high fuel flow, the voltage is not applied to the ceramic 52 and thus the full stroke movements of the valve is achieved, causing a wide dynamic range of controllable fuel flow. Of course, the voltage to be applied to the ceramic 52 may be varied continuously to correspond the fuel flow to be controlled in the same manner as the previously mentioned embodiment. Furthermore, the voltage signal to be applied to the ceramic 52 may be any one of four relations shown in FIG. 10. With this arrangement, the same fuel control characteristic as in the previous embodiment can be obtained. The other construction and operation are similar to those of the previous embodiment.

Having thus described the preferred embodiments of the invention, it should be understood that numerous structural modifications and adaptations may be made without departing from the spirit of the invention.

What is claimed is:

1. The method of controlling a fuel injector intermittently injecting liquid fuel to an engine comprising the steps of supplying a pulse signal to an actuator for reciprocating a valve body, varying the stroke of said valve body by a voltage signal applied to a stroke limiting member; changing the width of said pulse signal to thereby control the open time of said injector, and varying the voltage applied to said stroke limiting member to thereby control the stroke of said valve body.

2. The method as defined in claim 1, wherein said stroke limiting member comprises a piezoelectric ceramic stack.

3. The method as defined in claim 1, wherein the voltage signal applied to the stroke limiting member is zero at high fuel flow range.

4. The method as defined in claim 1, wherein the voltage signal applied to the stroke limiting member is varied continuously to correspond to the fuel flow range.

* * * * *